(12) United States Patent
Klusáček et al.

(10) Patent No.: US 11,327,032 B2
(45) Date of Patent: May 10, 2022

(54) METHOD OF EXAMINING A SAMPLE USING A CHARGED PARTICLE MICROSCOPE

(71) Applicant: FEI Company, Hillsboro, OR (US)

(72) Inventors: Jan Klusáček, Brno (CZ); Tomáš Tůma, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/867,972

(22) Filed: May 6, 2020

(65) Prior Publication Data
US 2020/0363349 A1 Nov. 19, 2020

(30) Foreign Application Priority Data
May 6, 2019 (EP) .................................... 19172810

(51) Int. Cl.
*G01N 23/2206* (2018.01)
*G01N 23/2209* (2018.01)
(Continued)

(52) U.S. Cl.
CPC ..... *G01N 23/2206* (2013.01); *G01N 23/2209* (2018.02); *G01N 23/2251* (2013.01);
(Continued)

(58) Field of Classification Search
CPC ........... G01N 23/2206; G01N 23/2209; G01N 23/2251; G01N 2223/072; G01N 2223/40;
(Continued)

(56) References Cited

U.S. PATENT DOCUMENTS 9,714,908 B2 7/2017 Owen et al.
9,991,087 B2 * 6/2018 de Jong ................ H01J 37/244
(Continued)

OTHER PUBLICATIONS

Hibbert, D. B., and N. Armstrong. "An introduction to Bayesian methods for analyzing chemistry data: Part II: A review of applications of Bayesian methods in chemistry." Chemometrics and Intelligent Laboratory Systems 97.2 (2009): 211-220 (Year: 2009).*
(Continued)

*Primary Examiner* — Wyatt A Stoffa (57) ABSTRACT

The invention relates to a method of examining a sample using a charged particle microscope, comprising the steps of providing a charged particle beam, as well as a sample, and scanning said charged particle beam over at least part of said sample. A first detector is used for obtaining measured detector signals corresponding to emissions of a first type from the sample at a plurality of sample positions. According to the method, a set of data class elements is provided, wherein each data class element relates an expected detector signal to a corresponding sample information value. The measured detector signals are processed, and processing comprises comparing said measured detector signals to said set of data class elements; determining at least one probability that said measured detector signals belong to a certain one of said set of data class elements; and assigning at least one sample information value and said at least one probability to each of the plurality of sample positions. Finally, sample information values and corresponding probability can be represented in data.

18 Claims, 4 Drawing Sheets

(51) Int. Cl.
*G01N 23/2251* (2018.01)
*H01J 37/244* (2006.01)
*H01J 37/28* (2006.01)

(52) U.S. Cl.
CPC ............ *H01J 37/244* (2013.01); *H01J 37/28* (2013.01); *G01N 2223/072* (2013.01); *G01N 2223/40* (2013.01); *G01N 2223/507* (2013.01); *H01J 2237/225* (2013.01); *H01J 2237/24507* (2013.01)

(58) Field of Classification Search
CPC ....... G01N 2223/507; G01N 2223/402; G01N 23/2252; G01N 23/04; G01N 23/20; G01N 23/203; G01N 23/22; G01N 2223/401; G01N 2223/405; H01J 37/222; H01J 37/244; H01J 37/28; H01J 2237/225; H01J 2237/24507; H01J 2237/2807; H01J 2237/2808; H01J 2237/24495; H01J 37/20
See application file for complete search history.

(56) References Cited

U.S. PATENT DOCUMENTS

| | | | |
|---|---|---|---|
| 2012/0292503 A1* | 11/2012 | Phifer, Jr | H01J 37/222 250/307 |
| 2014/0035943 A1* | 2/2014 | Statham | G06T 11/001 345/593 |
| 2015/0338358 A1* | 11/2015 | Owen | G01N 23/2252 250/305 |
| 2016/0086762 A1* | 3/2016 | de Jong | H01J 37/285 250/305 |
| 2016/0189922 A1* | 6/2016 | Kooijman | G01N 23/2252 250/307 |
| 2018/0233323 A1* | 8/2018 | Walsh | G01N 21/00 |
| 2019/0186910 A1* | 6/2019 | Fukuda | G03F 7/70625 |

OTHER PUBLICATIONS

Priority EP Application No. 19172810.4, Official Search Report dated Nov. 12, 2019.

* cited by examiner

METHOD OF EXAMINING A SAMPLE USING A CHARGED PARTICLE MICROSCOPE

FIELD OF THE INVENTION

The present description relates generally to methods and systems for examining a sample using a charged particle microscope.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically, in a SEM, backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image provides information on the topology of the sample to be examined.

In a process called "energy dispersive x-ray spectroscopy" or "EDS", the energies of x-rays coming from the sample in response to the electron beam are measured and plotted in a histogram to form a material specific spectrum. The measured spectrum can be compared to known spectra of various elements to determine which elements and minerals are present in said sample.

It is an object of the invention to provide an improved method of examining a sample using a charged particle microscope, in which in particular data acquisition and/or processing is improved.

SUMMARY

In one embodiment, a method of examining a sample comprises: providing a charged particle beam, as well as a sample; scanning said charged particle beam over at least part of said sample; obtaining, using a first detector, measured detector signals corresponding to emissions of a first type from the sample at a plurality of sample positions; providing a set of data class elements, wherein each data class element relates an expected detector signal to a corresponding sample information value; processing said measured detector signals, wherein said processing comprises, for each of the plurality of sample positions: comparing said measured detector signals to said set of data class elements; determining at least one probability that said measured detector signals belong to a certain one of said set of data class elements; and assigning at least one sample information value and said at least one probability to said sample position; and representing in data said plurality of sample positions with corresponding sample information values and corresponding probabilities. In this way, the data acquisition and/or processing is improved.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

A method for examining a sample comprises the steps of providing a charged particle beam, as well as a sample; scanning said charged particle beam over at least part of said sample, and obtaining, using a first detector, measured detector signals corresponding to emissions of a first type from the sample at a plurality of sample positions.

The method further comprises the step of providing a set of data class elements, wherein each data class element relates an expected detector signal to a corresponding sample information value. By providing a set of data class elements that include expected detector signals and corresponding sample information values, processing of the data can be more rapid and effective. The detected signals can be rapidly compared to the data class elements, and the corresponding sample information value can easily be assigned to a certain sample position.

According to the method as defined herein, the method further comprises the step of processing said measured detector signals, wherein said processing comprises, for each of the plurality of sample positions the step of comparing said measured detector signals to said set of data class elements. Then, at least one probability is determined that said measured detector signals belong to a certain one of said set of data class elements. It is conceivable that at least two probabilities are determined, wherein each probability indicates the probability that said measured detector signals belong to a certain one of said set of data class elements. Then, at least one sample information value and at least one probability are assigned to each of the plurality of sample positions.

To illustrate the above concept, the following examples are given.

As a first example, it is possible that a probabilistic classifier is used to compute the similarity of each input data point (i.e. detected signals) against the set of pre-defined or algorithmically determined classes. Given a single data point, the classifier computes a likelihood for each class. A higher likelihood for a class means that the data point is more likely to belong to that class. The probabilistic classifier can be simplified as a "hard classifier" that assigns exactly one class to each data point, for example by selecting the highest likelihood, in which case a "default" class is provided to accommodate for the data not covered by any other class.

As a second example, it is possible that EDS signal processing is used. In this case, it is possible to compare the measured spectrum at each point to the spectra as defined in the data class elements. Comparing an acquired signal to a predefined signal can be done relatively fast and accurate. During comparing, a similarity score of the acquired spectrum to the pre-defined spectrum can be calculated. Based on that, a probability can be established. For example, it is possible that a measured spectrum X differs from a known spectrum A, but the difference is only minor, such that the probability that the measured spectrum X indeed corresponds to the spectrum A is approximately 90%. Likewise, the measured spectrum X can differ from another known spectrum B, and the difference can be major, but it is still probable that the measured spectrum X actually corresponds to spectrum B. The probability can be set to approximately 10%. Thus, the measured spectrum X has a probability p=0.9 for spectrum A and p=0.1 for spectrum B. The corresponding element or material (i.e. the sample information value as defined in the data class element) can then be assigned to the specific sample location.

As a next step, the method comprises the step of representing in data said plurality of sample positions with corresponding sample information values and corresponding probabilities. Said data can be an image, or a table, or any other representation in data.

With the method as described above, rapid processing of complex signals becomes possible, and at the same time the user is presented with a measure of confidence in the output data.

In an embodiment, the representing in data comprises the use of a grey-scale image that includes color information to represent the sample information value and corresponding probabilities. In an embodiment, the grey-scale image comprises data obtained from detected backscattered electrons in SEM mode, and the color information is based on x-ray EDS data.

In an embodiment, the data class elements are at least partly pre-defined. Pre-defining can be initiated by a user, or by a processing device. Said data class elements can additionally be determined by an algorithm. Determining can comprise the step of initiating said set of data class elements, and/or updating said set of data class elements. Said algorithm may comprise a machine learning algorithm, to improve the quality of the set of data class elements during or after an experiment.

In an embodiment, said step of determining at least one probability may comprise the step of using a probabilistic classifier. Said probabilistic classifier may comprise one or more elements from the group consisting of: fuzzy logic rules, Gaussian Mixture Model, and Latent Dirichlet Allocation classifier.

In an embodiment, it is conceivable that a measured detector signal is more or less equally categorizable into at least two data class elements. In this embodiment, it is possible that at least two probabilities are determined, wherein each probability indicates the probability that said measured detector signals belong to a certain one of said set of data class elements.

In an embodiment, use is made of a Bayesian operator in case a measured detector signal is categorized into at least two data class elements. The Bayesian operator infers the probability of the input data belonging to individual classes defined in the set of data class elements. As an example, in EDS a spectrum is estimated to have 90% copper and 10% oxygen, in which copper and oxygen can be pre-defined data class elements, for example based on fuzzy logic rules. The process in this embodiment can be controlled by prior probabilities of each data class element, that can enhance or suppress the prevalence of individual classes.

As described above, it is conceivable that representing in data comprises the step of providing an image containing said data. With reference to an HSV color space, a set of colors representing said set of data class elements may be provided, and said set of colors may be used for providing said image. The HSV color space is a color space that uses hue (often referred to as "color", e.g. red, green, blue), saturation (often referred to as the intensity or pureness of the color) and value (often referred to as lightness or darkness of the color) to describe attributes of a specific color. In principle, any color can be described in the HSV color space regardless of the actual color space being used. Thus, the method as described herein is not limited to the use of a specific color space and can be applied in an RGB color space (since all RGB colors can be described with reference to an HSV color space as well) as well, or any other color space for that matter.

In an embodiment, said set of colors uses hue information and/or saturation information for encoding said data class elements. In particular, hue information may be used for encoding sample information value. Said set of colors may use hue information and/or saturation information for encoding said probability. A more saturated color may correspond to a higher probability, for example. Said probability may also be encoded by mixing two or more hues associated with a corresponding two or more data class elements.

In an embodiment, the method comprises the step of detecting, using a second detector, emissions of a second type from the sample in response to the beam scanned over the area of the sample, and using value information for encoding said emissions of said second type in said image. In particular, said second detector may be a backscattered detector.

In an embodiment, said first detector is used for obtaining spectral information of detected emissions of the first type. In particular, said first detector may be used for acquiring EDS data.

According to an aspect, a charged particle microscope for examining a sample using the method as described herein is provided, wherein said charged particle microscope comprises:
  an optics column, including a charged particle source, a final probe forming lens and a scanner, for focusing a beam of charged particles emitted from said charged particle source onto a specimen;

a specimen stage positioned downstream of said final probe forming lens and arranged for holding said specimen;

a first detector for detecting emissions of a first type originating from said specimen in response to the incidence of charged particles emitted from said charged particle source; and a control unit and a processing device connected to said first detector.

According to this aspect, the charged particle microscope is arranged executing one or more embodiments of the method as described herein. Advantages of such a charged particle microscope have already been elucidated above with respect to the embodiments of the method.

Figure 1:
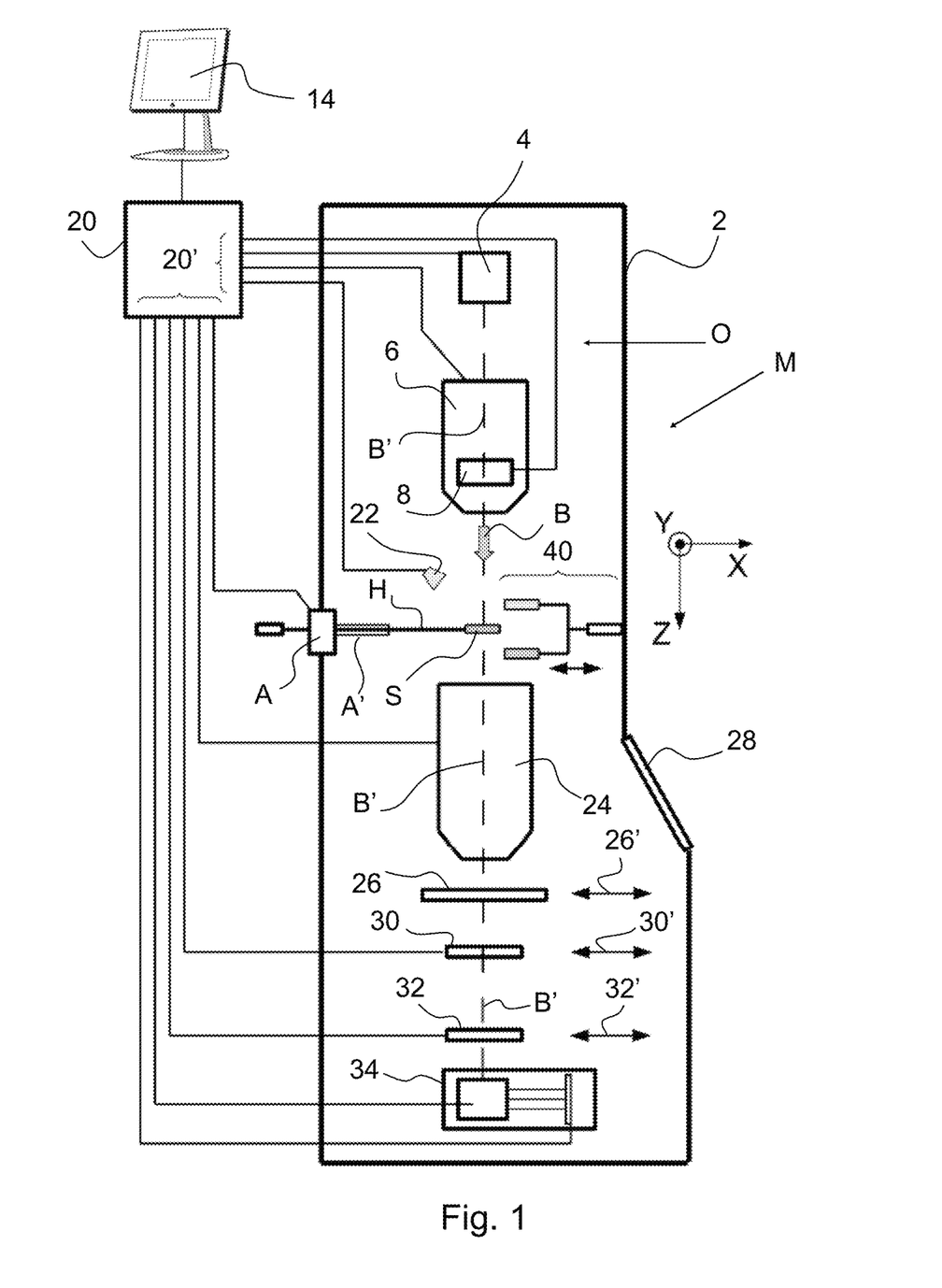
FIG. 1 shows a longitudinal cross-sectional view of a charged particle microscope according to a first embodiment of the invention.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M according to the invention, and of which an embodiment is shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is the analysis device 22, which—as mentioned before—might be a combined scintillator/photomultiplier or EDS (Energy-Dispersive X-Ray Spectroscopy) module. In a preferred embodiment, said first detector is an EDS. Furthermore, the apparatus according to the invention comprises the control device 20 that is connected (by means of lines 20') to said first detector 22 (schematically shown). According to the invention, said charged particle microscope M is arranged for executing the method according to the invention, which will later be explained by means of FIG. 3 to FIG. 8.

Figure 2:
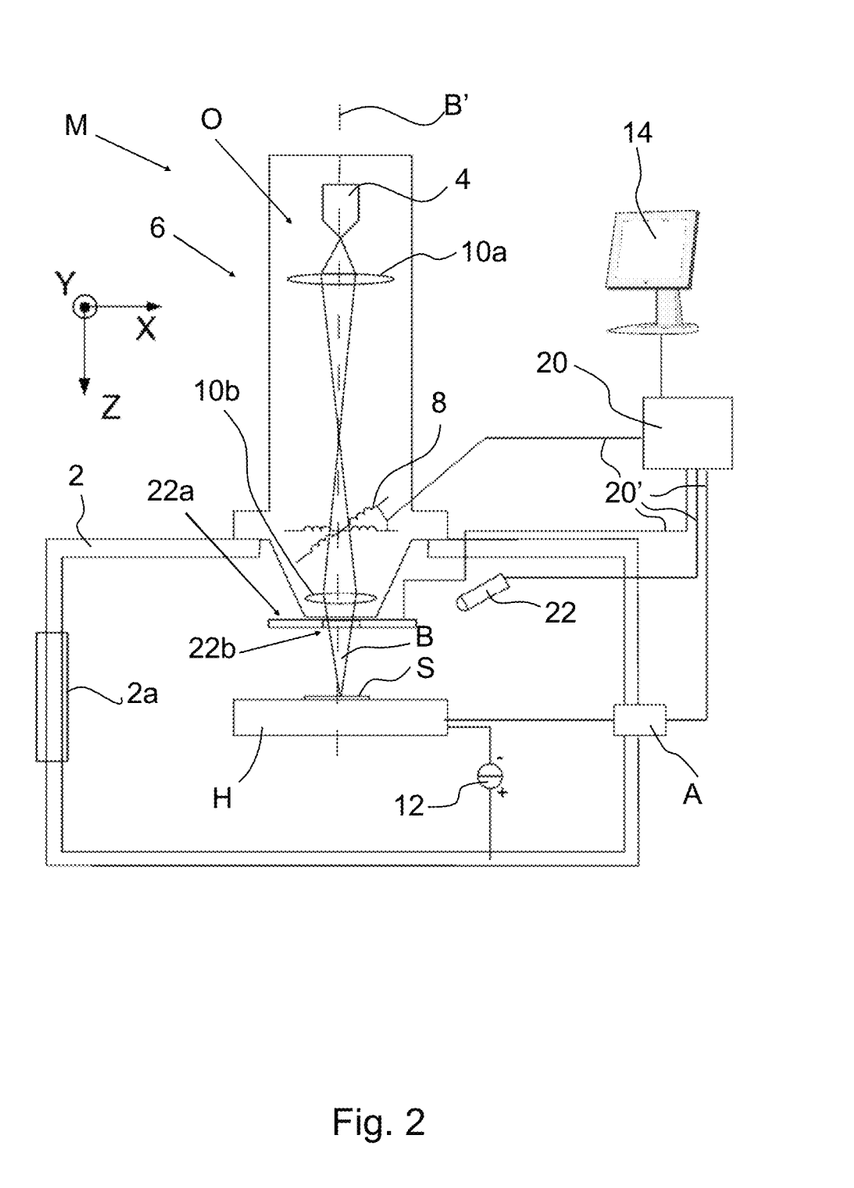
FIG. 2 shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2*a*: A vacuum port, which may be opened so as to introduce/remove items (components, specimens) to/from the interior of vacuum chamber 2, or onto which, for example, an ancillary device/module may be mounted. The microscope M may comprise a plurality of such ports 2*a*, if desired;

10*a*, 10*b*: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22*a*, 22*b*: A segmented electron detector 22*a*, comprising a plurality of independent detection segments (e.g. quadrants) disposed about a central aperture 22*b* (allowing passage of the beam B). Such a detector can, for example, be used to investigate (the angular dependence of) a flux of output (secondary or backscattered) electrons emerging from the specimen S.

Thus the charged particle microscope M as shown in FIG. 2 comprises an optics column O, including a charged particle source 4, a final probe forming lens 6, 10*a*, 10*b* and a scanner 8, for focusing a beam B of charged particles emitted from said charged particle source 4 onto a specimen S. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is said analysis device 22, which—as mentioned before—might be a combined scintillator/photomultiplier or EDS (Energy-Dispersive X-Ray Spectroscopy) module. In an alternative embodiment, the first detector 22 may be the segmented detector 22*a*, 22*b*. In a preferred embodiment, said first detector is an EDS. Furthermore, the apparatus according to the invention comprises said control device 20 that is connected (by means of lines 20') to said first detector 22.

The apparatus shown in FIG. 1 and FIG. 2 may be used in examining a sample with a method according to the invention. In general, embodiments of the method all comprise the general steps of:

Scanning said charged particle beam B over at least part of said sample S;

Obtaining, using a first detector 22, measured detector signals corresponding to emissions of a first type from the sample S at a plurality of sample positions;

Processing said measured detector signals; and

Representing in data said measured detector signals.

According to the method as defined herein, processing requires several steps, which steps are explained by means of embodiments that are shown in FIG. 3 to FIG. 6.

Figure 3:
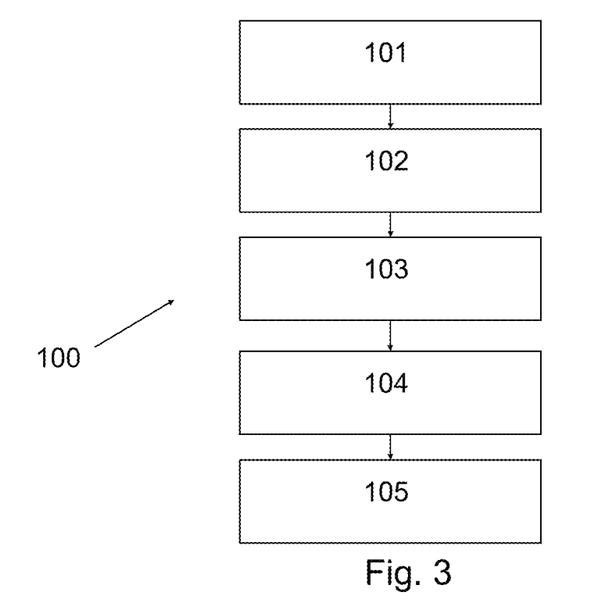
FIG. 3 shows an embodiment of the method as disclosed herein.

Now referring to FIG. 3, an embodiment of the method as described herein is shown. Said method 100 comprises the step of providing 101 a set of data class elements, wherein each data class element relates an expected detector 22 signal to a corresponding sample information value. Said method further comprises the step of comparing 102 said measured detector signals to said set of data class elements (as provided in step 101). Then, in step 103 at least one probability is determined, wherein said probability indicates a probability that said measured detector signals belong to a certain one of said set of data class elements. Based on that, at least one sample information value and said at least one probability are assigned 104 to each of the plurality of sample positions. With that, it is possible to represent 105 in data said plurality of sample positions with corresponding sample information values and corresponding probabilities.

Figure 4:
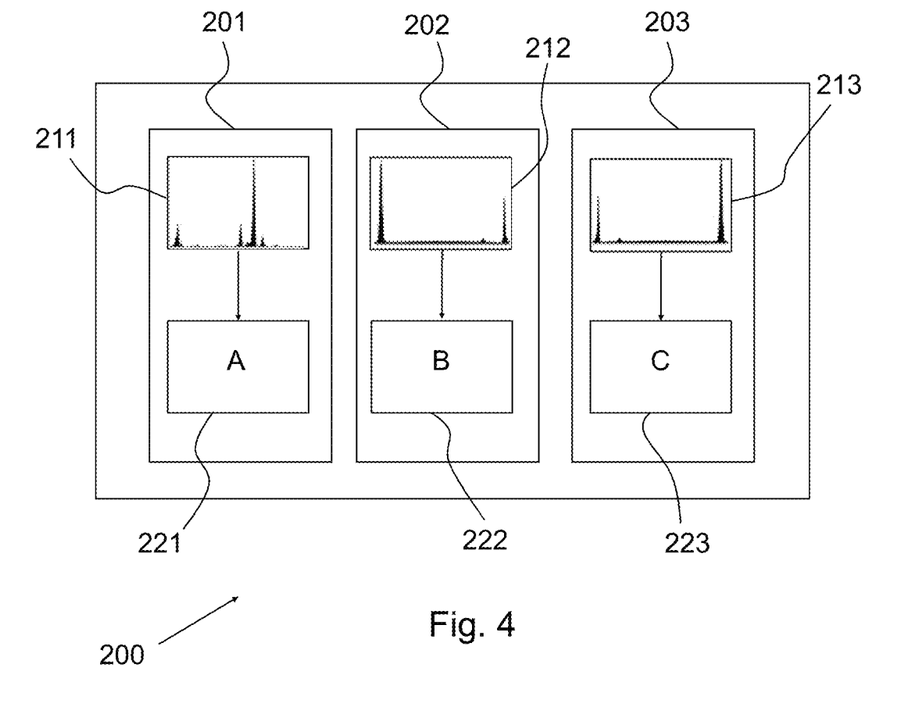
FIG. 4 shows an embodiment of a set of data class elements.

FIG. 4 shows an example of a set 200 of data class elements 201-203, wherein each data class element 201-203 relates an expected detector signal 211-213 to a corresponding sample value information value 221-223. In the example shown, a total of three data class elements 201-203 are used, but it is noted that in principle any number of data class elements can be used. A limited number of data class elements is useful when one is only interested in certain data values, and other data values can be classified as "others". A limited set of data class elements speeds up data processing.

In the example shown in FIG. 4, the data class elements 201-203 are used to relate expected spectra 211-213 to data values 221-223 that are used to denote substances A-C. Data class element 201 relates a specific spectrum 211 to the data value 221 "substance A", data class element 202 relates another spectrum 212 to the data value 222 "substance B", and data class element 203 relates a further spectrum 213 to the data value 223 "substance C".

During performing of the method, when the sample is being investigated, detector signals will be obtained. The detector signals can be encoded into a spectrum, and this spectrum can be compared to the data class elements 201-203. It is conceivable that the measured spectrum has some similarities to one or more of the pre-defined data class elements 201-203. For example, the measured spectrum could be 20% similar to spectrum 211, 10% similar to spectrum 212, and 70% similar to spectrum 213. This similarity score already gives an indication that it is likely that the measured spectrum belongs to the data value 223 of "substance C". This data value and the corresponding probability, which could be equal to the similarity score of 70% or could be another value based on a further calculation, is then assigned to the respective sample position. Thus, here a sample information value (the measured position comprises substance C) and its probability is assigned to the respective sample position, and this can be represented in data by storing it in a data memory or by showing it to the user.

Figure 5:
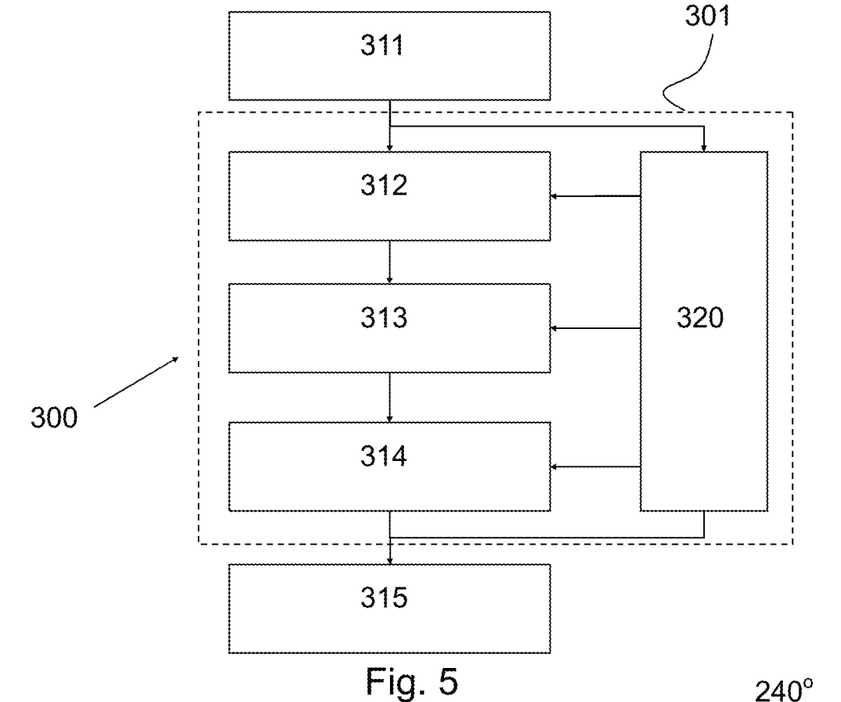
FIG. 5 shows the use of an algorithm in the method as disclosed herein.

FIG. 5 shows a flow chart 300 of an embodiment of an algorithm 301 that incorporates the method as described herein, wherein in particular a colored image is provided as the representation in data. In FIG. 5, input data 311, in particular measured detector signals or processed detector signals such as spectra, are provided as input to the algorithm 301. In step 312 a probability classifier processes the data to determine likelihoods. In step 313 use is made of a Bayesian operator. The Bayesian operator infers the probability that the input data 311 that was processed in step 312 actually belongs to one or more of the individual classes defined in the set of data class elements (see FIG. 4). With this, in step 314 a representation using color properties can be defined. Then a final data representation 315 can be given as output data. This can be a colored image, for example. The algorithm further comprises several parameters 320 that are used in steps 312-314, and these parameters may be static and/or dynamic. The parameters can, for example, comprise built-in machine learning methods that learn with each incoming data point, and infer the definition of data class elements automatically, which reduces the number of steps the user has to go through.

The embodiment shown in FIG. 5 uses a probabilistic classifier 312, a Bayesian operator 313, and a color mixing step 314. The probabilistic classifier computes the similarity of each input data point against a set of pre-defined or algorithmically determined classes. These classes can be defined either manually (by the user), or automatically (by machine learning). Given a single data point, the classifier computes a likelihood for each class. A higher likelihood for a class means that the data point is more likely to belong to that class. The probabilistic classifier can be simplified as a "hard classifier" that assigns exactly one class to each data point, for example by selecting the highest likelihood, in which case a "default" class is provided to accommodate for the data not covered by any other class. We propose various realizations of the probabilistic classifier that suit various modalities and applications. In EDS, a classifier based on fuzzy logic rules (manual classification), a classifier using a Gaussian Mixture Model applied to chemical quantification data, and a Latent Dirichlet Allocation (LDA) classifier applied to sparse EDS spectra, can be used.

As an example, in EDS a measured spectrum 311 (showing, for example 90% silicon and 10% oxygen) is input to the algorithm. Data classes are provided, such as C1 corresponding to Silicon (Si) and C2 corresponding to $Si_xO_x$. Data classes can thus correspond to chemical elements, but also to compositions. The measured spectrum is analyzed and data values (e.g. Si, $Si_xO_x$) and a number of probabilities are attached to it in step 312. Based on those probabilities, the Bayesian operator can further process that data, and conclude that given the data the probability of the chemical distribution is: 98% Si and 2% $Si_xO_x$. Hence, it is most likely that the measured spectrum actually belongs to Silicon in this case. However, to output the probability, it is possible to use color mixing in step 314 for outputting a colored image. The color mixing may comprise mixing color hues, in an amount corresponding to the determined probability, and output may comprise a single (mixed) color hue.

Figure 6:
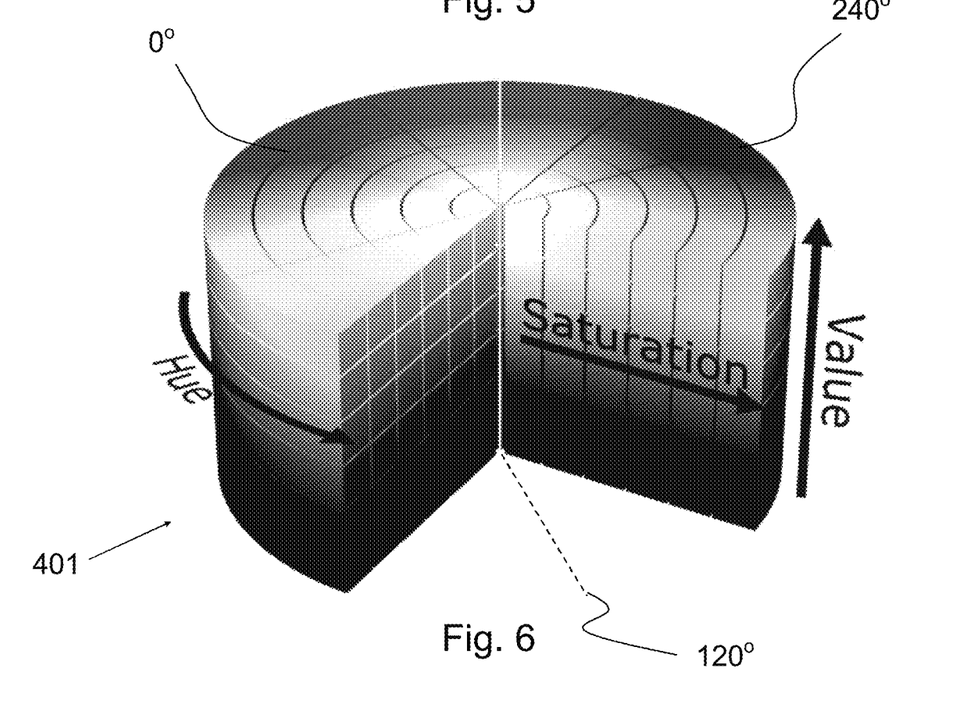
FIG. 6 shows a representation of hue saturation value (HSV) color space.

FIG. 6 shows an example of the HSV color space 401 that can be used in the representing in data of the obtained result. The HSV color space 101 is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry as shown in FIG. 3, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0 (bottom part in FIG. 3), to white at value 1 (top part of FIG. 3). With increasing radius, i.e. from the center outwards, the saturation of the color increases. Details of the HSV color space are known per se to those skilled in the art of color spaces.

Now referring back to FIGS. 4 and 5, it is conceivable that certain hues are associated to certain data class elements 201-203. For example, the color hue red can be associated with data class element 201, and the color hue blue can be associated with data class element 202. In case the algorithm of FIG. 5 indicates that the probability of the chemical distribution is approximately 90% "substance A" and approximately 10% "substance B", then those color hues can be mixed, in a ratio 90-10 for example, and output into a final image representation. This way, the user can see that the substance is likely "substance A" as the color hue used resembles red, but the user also sees that it is not 100% certain that it actually is "substance A".

Embodiments of the method as described herein provide a generic algorithmic framework for translating multimodal scalar or spectral data (e.g. EDS spectra, photoluminescence, etc.) into color that can subsequently be mixed with a grayscale image. The framework presented here can be based on a probabilistic classifier 312 that defines a number of data class elements (e.g. different elements or phases) and assigns a prior probability (weight) and color to each of the data class elements, subsequently processing them using Bayesian mathematics.

Embodiments of the invention have described herein. The desired protection is conferred by the appended claims.

The invention claimed is:

1. A method of examining a sample using a charged particle microscope, comprising:
   Providing a charged particle beam, as well as a sample;
   Scanning said charged particle beam over at least part of said sample;
   Obtaining, using a first detector, measured detector signals corresponding to emissions of a first type from the sample at a plurality of sample positions;
   Providing a set of data class elements, wherein each data class element relates an expected detector signal to a corresponding sample information value;
   Processing said measured detector signals, wherein said processing comprises, for each of the plurality of sample positions:

Comparing said measured detector signals to said set of data class elements and generating a similarity score for each set of data class elements;

Determining at least one probability that said measured detector signals belong to a certain one of said set of data class elements based on the similarity score; and Assigning at least one sample information value and said at least one probability to said sample position; and Generating an image representing said plurality of sample positions with corresponding sample information values and corresponding probabilities, wherein the image is a grey-scale image including color information to represent the sample information values and corresponding probabilities.

2. The method according to claim 1, wherein said set of data class elements is at least partly pre-defined.

3. The method according to claim 2, wherein said set of data class elements is at least partly determined by means of an algorithm.

4. The method according to claim 2, wherein said set of data class elements is at least partly determined by means of a processing unit.

5. The method according to claim 1, wherein in case a measured detector signal is categorized into at least two data class elements, said at least one probability that said measured detector signals belong to a certain one of said at least two data class elements is determined based on the similarity scores corresponding to the categorized data class elements.

6. The method according to claim 1, comprising the step of providing, with reference to a hue saturation value (HSV) color space, a set of colors representing said set of data class elements, and using said set of colors for providing said image.

7. The method according to claim 6, wherein said set of colors uses hue information for encoding said data class elements.

8. The method according to claim 6, wherein said set of colors uses hue information and/or saturation information for encoding said probability.

9. The method according to claim 8, wherein encoding said probability comprises mixing two or more hues associated with a corresponding two or more data class elements.

10. The method according to claim 1, further comprising the step of detecting, using a second detector, emissions of a second type from the sample in response to the beam scanned over the area of the sample, and using value information for encoding said emissions of said second type in said image.

11. The method according to claim 1, wherein said first detector is used for obtaining spectral information of detected emissions of the first type.

12. A charged particle microscope for examining a sample, comprising:
an optics column, including a charged particle source, a final probe forming lens and a scanner, for focusing a beam of charged particles emitted from said charged particle source onto a specimen;
a specimen stage positioned downstream of said final probe forming lens and arranged for holding said specimen;
a first detector for detecting emissions of a first type originating from said specimen in response to the incidence of charged particles emitted from said charged particle source; and
a control unit and a processing device connected to said first detector;

wherein said charged particle microscope is arranged to:
Scan said charged particle beam over at least part of said specimen;
Obtain, using the first detector, measured detector signals corresponding to emissions of a first type from the specimen at a plurality of sample positions;
Provide a set of data class elements, wherein each data class element relates an expected detector signal to a corresponding sample information value;
Process said measured detector signals, wherein said processing comprises, for each of the plurality of sample positions:
Comparing said measured detector signals to said expected detector signals of said set of data class elements, and generating a similarity score for each set of data class elements;
Determining at least one probability that said measured detector signals belong to a certain one of said set of data class elements based on the similarity scores; and
Assigning at least one sample information value and said at least one probability to said sample position; and
Generate an image representing said plurality of sample positions with corresponding sample information values and corresponding probabilities, wherein the image is a grey-scale image including color information to represent the sample information values and corresponding probabilities.

13. The charged particle microscope of claim 12, wherein at least two probabilities are determined for at least one of the plurality of sample positions, and represent in data said plurality of sample positions with corresponding sample information values and corresponding probabilities includes: assign a hue to each of the data class elements, and represent the at least one of the plurality of sample positions by mixing hues of corresponding class elements based on the at least two determined probabilities.

14. The charged particle microscope of claim 13, further comprising a second detector for detecting emissions of a second type from the sample in response to the beam scanned over the area of the sample, and said charged particle microscope is further arranged to use value information for encoding said emissions of said second type in said image.

15. The charged particle microscope of claim 12, wherein determining at least one probability that said measured detector signals belong to a certain one of said set of data class elements based on the similarity scores includes inferring said at least one probability that said measured detector signals belong to said set of data class element from the similarity scores, and enhancing or suppressing a prevalence of individual class elements by adjusting prior probabilities of each data class elements.

16. A method of examining a sample using a charged particle microscope, comprising:
Scanning a charged particle beam over at least part of the sample;
Obtaining measured detector signals at a plurality of sample positions;
Providing a set of data class elements, wherein each data class element relates an expected detector signal to a corresponding sample information value;
Processing said measured detector signals, wherein said processing comprises, for each of the plurality of sample positions:

Determining similarities between said measured detector signals and said expected detector signals of said set of data class elements, and generating a similarity score for each set of data class elements;

Determining at least one probability that said measured detector signals belong to a certain one of said set of data class elements based on the similarity scores; and Assigning at least one sample information value and said at least one probability to said sample position; and Generating an image representing said plurality of sample positions with corresponding sample information values and corresponding probabilities, wherein the image is a grey-scale image including color information to represent the sample information values and corresponding probabilities.

17. The method of claim 16, wherein in case a measured detector signal is categorized into at least two data class elements, determining at least one probability that said measured detector signals belong to a certain one of said set of data class elements includes determining said at least one probability that said measured detector signals belong to said at least two data class elements based on the similarity scores corresponding to the categorized data class elements.

18. The method of claim 17, wherein representing in data said plurality of sample positions with corresponding sample information values and corresponding probabilities includes: responsive to a particular sample position associated with two or more data class elements, setting a hue of said sample position by mixing two or more hues associated with said two or more data class elements based on the corresponding probabilities.

* * * * *